United States Patent [19]

Fielder et al.

[11] Patent Number: 5,579,404
[45] Date of Patent: Nov. 26, 1996

[54] DIGITAL AUDIO LIMITER

[75] Inventors: Louis D. Fielder, Millbrae; Marina Bosi-Goldberg, Menlo Park; Grant A. Davidson, Oakland; Kenneth J. Gundry, San Francisco, all of Calif.

[73] Assignee: Dolby Laboratories Licensing Corporation, San Francisco, Calif.

[21] Appl. No.: 17,535

[22] Filed: Feb. 16, 1993

[51] Int. Cl.$^6$ ..................................................... H03G 7/00
[52] U.S. Cl. ........................... 381/106; 381/101; 381/107
[58] Field of Search ................................... 381/106, 102, 381/104, 101, 107, 98, 47, 33; 455/72, 306, 303; 333/14; 370/7

[56] References Cited

U.S. PATENT DOCUMENTS

| | | | |
|---|---|---|---|
| 4,337,445 | 6/1982 | Akagiri | 333/14 |
| 4,363,006 | 12/1982 | Ishigaki et al. | 455/72 |
| 4,604,755 | 8/1986 | Murray | 381/107 |
| 4,701,953 | 10/1987 | White . | |
| 4,882,761 | 11/1989 | Waldhauer | 381/106 |
| 5,020,098 | 5/1991 | Celli | 381/1 |
| 5,040,217 | 8/1991 | Brandenburg et al. | 381/47 |
| 5,050,217 | 9/1991 | Orban | 381/106 |
| 5,175,770 | 12/1992 | Back | 381/98 |
| 5,278,912 | 1/1994 | Waldhauer | 381/106 |
| 5,371,803 | 12/1994 | Williamson, III | 381/104 |

FOREIGN PATENT DOCUMENTS

| | | |
|---|---|---|
| 1028627 | 3/1978 | Canada . |
| 0078130 | 5/1983 | European Pat. Off. . |

OTHER PUBLICATIONS

"Delaying the Present Moment: EMT 266 Transient Limiter," EMT Courier, Jun. 1979, pp. 9–11.

Mapes-Riordan and Leach, "The Design of a Digital Signal Peak Limiter for Audio Signal Processing," *J. Audio Eng. Soc.*, vol.36, Jul./Aug. 1988, pp. 562–574.

Shorter, et al., "The Dynamic Characteristics of Limiters for Sound Programme Circuits," BBC Research Report EL–5, Serial No. 1967/13, Apr. 1967, pp. 1–13.

Blesser, "Audio Dynamic Range Compression for Minimum Perceived Distortion," *IEEE Trans. Audio Electroacoust.*, vol. AU–17, No. 1, Mar. 1969, pp. 22–32.

Gleave, et al., "Variable–Emphasis Limiters for Sound–Programme Signals," *International Broadcasting Convention*, London Sep. 1976, pp. 149–53.

McNally, "Dynamic Range Control of Digital Audio Signals,"*J. Audio Eng. Soc.*, vol. 32, No. 5, May 1984, pp. 316–27.

Bosi, "Low–Cost/High–Quality Digital Dynamic Range Processor," *91st AES Convention*, New York, Oct. 1991, preprint 3133.

"DP90 Digital Audio Encoder User's Manual," Dolby Laboratories Inc., 1992, p. 4–3 and schematic Figure 6.2.

*Primary Examiner*—Curtis Kuntz
*Assistant Examiner*—Ping W. Lee
*Attorney, Agent, or Firm*—Thomas A. Gallagher; David N. Lathrop

[57] ABSTRACT

A signal processing system comprising components such as split-band perceptual coders can receive a peak amplitude limited input audio signal and can process the signal in such a manner that the processed signal preserves the apparent loudness of the input signal but is no longer peak-amplitude limited. In one embodiment, upsampling is used in estimating the resultant peak amplitude and gain factors established in response to the estimated peak amplitude are applied to one or more frequency subbands of the processed signal.

15 Claims, 7 Drawing Sheets

DIGITAL AUDIO LIMITER

TECHNICAL FIELD

The invention relates in general to limiting the peak amplitude of an audio signal. More particularly, the invention relates to limiting the peak amplitude of one or more frequency subbands of an audio signal while preserving the apparent loudness.

BACKGROUND ART

There is considerable interest among those in the fields of broadcasting and recording to reduce the amount of information required to transmit or record an audio signal intended for human perception without degrading its subjective quality. Analog signals with reduced informational requirements can be carried within narrower bandwidths, and digital signals with reduced information requirements can be carried at lower bit-rates.

One common technique used to reduce the informational requirements reduces the dynamic range of the audio signal to be transmitted or recorded. Dynamic range control is used to protect equipment from excessively high-amplitude signals and to achieve certain artistic results. In general, the overall goal of dynamic range control is to alter the dynamic range of an audio signal without introducing any other perceptible distortion.

In broadcasting, for example, the dynamic range of audio signals is "compressed" prior to broadcast to avoid overloading transmission equipment and/or to avoid severe audible distortion. Similar concerns apply to conventional tape and disc recordings.

Dynamic range "compression" reduces the dynamic range of an input signal by applying a gain factor less than one over a range of input signal amplitude. A "compressor" provides for signal amplitude compression. A "limiter" provides "limiting" which is a special case of compression, preventing the peak-amplitude of an input signal from exceeding a specified level by applying a very low gain factor to high-level signals.

A second common technique used to reduce the informational requirements of an audio signal reduces the amount of information used to represent or code the audio signal; however, as the amount of information is reduced, encoding inaccuracies increase and may become audible in the form of "coding noise." Coding noise degrades the subjective quality of the coded signal. So-called psychoacoustic-coding or perceptual-coding techniques attempt to reduce the informational requirements of an audio signal without introducing audible coding noise. Two examples of "split-band" perceptual-coding techniques are subband coding and transform coding. Perceptual-coding techniques exploit a characteristic of human hearing; a stronger signal may mask or render inaudible a weaker signal if the two signals are sufficiently close in frequency. By splitting an audio signal into narrow frequency bands and independently coding the signal energy in each band, the aural effect of the coding noise is more likely to be inaudible because it is confined to the same frequency band as the coded spectral energy.

Coding systems which implement perceptual-coding techniques attempt to reproduce a representation of the input audio signal which preserves the perceived loudness of input signal spectral components. This is often accomplished by preserving some measure of spectral amplitude such as root-mean-square (RMS); however, many perceptual-coding systems lead to uncertainties in the peak-amplitude level of the reproduced signal. This uncertainty may include an increase in peak-amplitude, referred to herein as "peak-level increase" or PLI, which is tolerable in many coding applications where it is inaudible.

One application which uses both compression and informational reduction coding techniques is the Studio-Transmitter Link (STL) for broadcasting which delivers an audio signal originating from a studio to a broadcast transmitter. Typically, an STL includes a compressor and limiter which reduces the dynamic range and limits the peak-amplitude level of an audio signal, a perceptual-encoder which reduces the informational capacity requirements of the audio signal, a communications channel for delivering the encoded signal, and a perceptual-decoder for reproducing the compressed and limited audio signal for subsequent broadcast.

An STL is one example of an application which cannot tolerate excessive amounts of PLI. Because of PLI, the peak-amplitude of the signal reproduced by the perceptual-decoder may sometimes exceed the capabilities of the broadcast transmitter even though the peak amplitude of the audio signal input to the perceptual-encoder is properly limited. Transmitter overload resulting from PLI can create audible distortion and/or impermissible broadcast conditions.

Known techniques for controlling PLI include clippers, instantaneous gain reduction amplifiers, and conventional wide-band limiters. Unfortunately, these techniques introduce undesirable audible distortion in the reproduced signal. Clippers generate excessive harmonic distortion. Instantaneous gain reduction amplifiers, in effect, smear spectral components in the frequency domain. Conventional wideband limiters reduce the perceived loudness of the reproduced signal.

DISCLOSURE OF INVENTION

It is an object of the present invention to provide for a signal processing system in which both apparent loudness of the reproduced audio signal and PLI are controlled within acceptable levels.

It is a further object of the present invention to provide for a signal processing system in which a high-quality representation of the input audio signal is reproduced.

These objects are achieved by the invention as claimed.

In accordance with the teachings of various aspects of the present invention in one embodiment, a signal processing system receives a peak-amplitude limited input audio signal, generates a processed audio signal in response to the input audio signal such that peak-level increase may be present, estimates the peak-level increase of the full-bandwidth processed audio signal, and generates an output audio signal by applying to the portion of the full-bandwidth subject to PLI a gain factor adapted in response to the estimated peak amplitude.

In accordance with the teachings of another aspect of the present invention, a signal processing system receives a peak-amplitude limited input audio signal, generates a processed audio signal in response to the input audio signal such that peak-level increase may be present, estimates the peak-level increase of the full-bandwidth processed audio signal, and generates an output audio signal by applying to portions of the full-bandwidth subject to PLI a plurality of gain factors adapted in response to the estimated peak amplitude.

The present invention is generally applicable to signal processing which is subject to PLI. As discussed above, many perceptual-coding systems and methods are known in the art which generate, in response to a peak-amplitude limited input audio signal, a processed audio signal with PLI. Of significance to practical embodiments of the present invention, the inventors have determined empirically that in broadcast STL applications, the predominant audible effects caused by PLI generated by perceptual-coders are confined to high-frequencies above about 5 kHz. It is therefore possible to adequately correct for PLI by applying an appropriate gain factor to only those high-frequency signal components.

A low-pass filter (LPF) with a frequency-dependent phase shift can also preserve apparent loudness but permit PLI. For example, such a 20 kHz LPF receiving a 6 kHz square wave input signal will pass the third harmonic at 18 kHz with its phase shifted relative to the phase of the fundamental frequency. If the relative phase shift is of an appropriate amount, the third harmonic will combine with the fundamental frequency to increase the peak amplitude rather than to flatten the waveform and reduce the peak amplitude. Although the apparent loudness of the low-pass filtered signal may be preserved, the peak-amplitude of the passed signal will increase.

The present invention is also applicable to practical implementations of components such as digital-to-analog converters and anti-aliasing filters which generate PLI. Other applications will be known to those skilled in the art.

Various aspects of the present invention and its preferred embodiments are set forth in greater detail in the following "Modes for Carrying Out the Invention" and in the accompanying drawings. It should be appreciated that the following discussion sets forth several embodiments by way of example only, and that these examples are not intended to set forth any limitations in application or implementation.

Although the following discussion is more particularly directed toward digital split-band coding within an STL application, the present invention is not so limited. As discussed briefly above, aspects of the present invention are applicable to a broader variety of signal processing systems. Furthermore, the present invention may be embodied in systems implemented by analog techniques as well as digital techniques.

MODES FOR CARRYING OUT THE INVENTION

A. Introduction

Figure 10A:
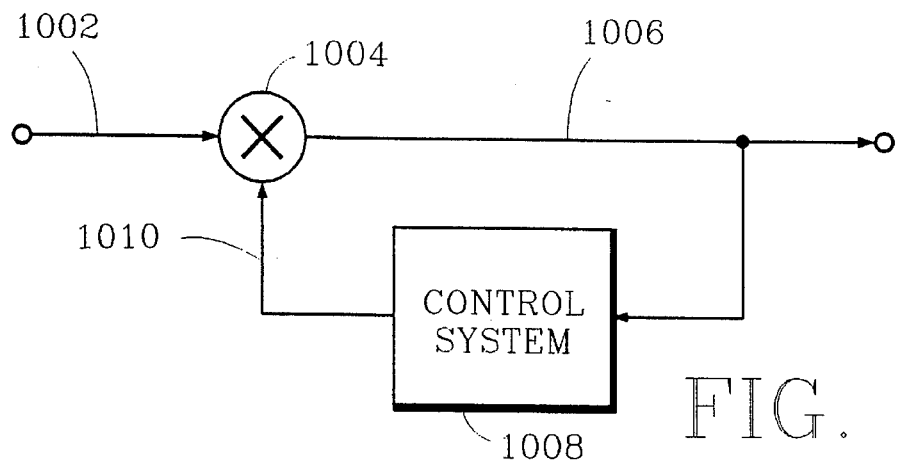
FIGS. 10a–10c illustrate functional block diagrams of three types of limiters.
Figure 10B:
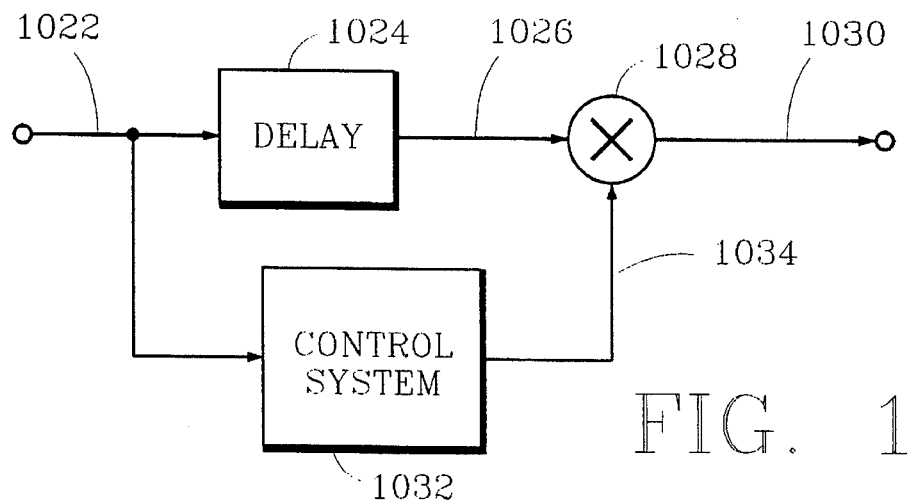
Figure 10C:
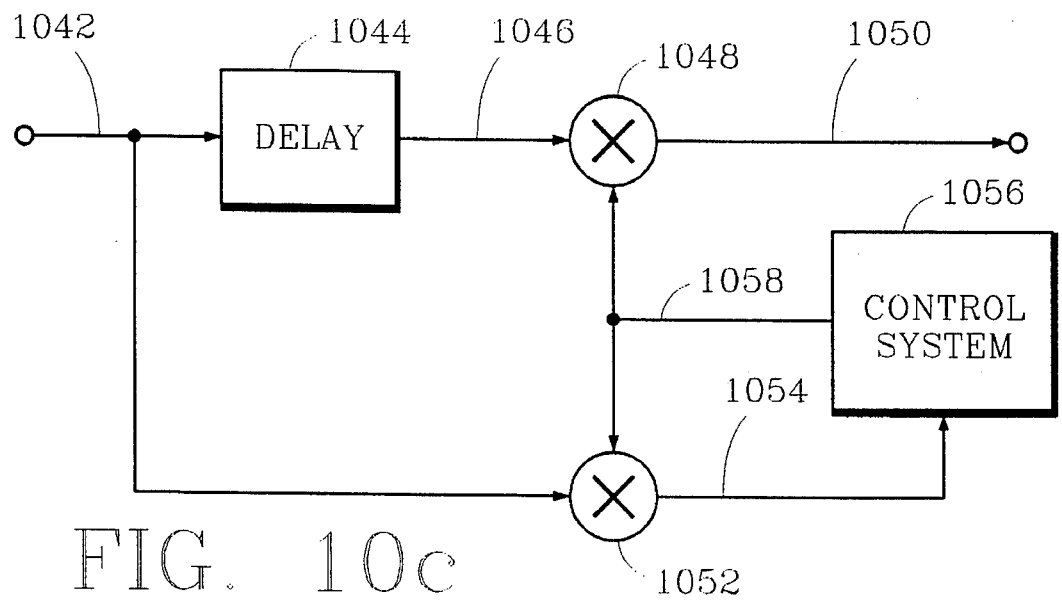

FIGS. 10a–10c illustrate functional block diagrams of three types of limiters. The limiter shown in FIG. 10a is an output-controlled limiter which uses negative feedback. Gain element 1004 receives an input signal from path 1002 and generates an output signal along path 1006 by applying a variable gain factor to the input signal. Control system 1008 receives the output signal from path 1006 and passes a gain control signal along path 1010 which selects the gain factor used by gain element 1004. Output-controlled limiters are very tolerant of variations in the characteristics of the control system and the gain element, but they cannot avoid overshoot in the output signal because of the inherent delay in the control system.

The limiter shown in FIG. 10b is an input-controlled limiter. Delay element 1024 receives an input signal from path 1022 and passes the delayed signal along path 1026 to gain element 1028. Control system 1032 receives the input signal from path 1022 and generates a gain control signal along path 1034 which selects the gain factor used by gain element 1028. Gain element 1028 receives the delayed input signal from path 1026 and generates an output signal along path 1030 by applying a variable gain factor to the delayed input signal. Input-controlled limiters require a control system and a gain element with precisely known characteristics. This is usually much easier to implement with digital technologies than it is to implement with analog technologies; however, input-controlled limiters can avoid overshoot in the output signal by using a delay element.

The limiter shown in FIG. 10c is a hybrid of the other two types of limiters. Delay element 1044 receives an input signal from path 1042 and passes the delayed signal along path 1046 to gain element 1048. Gain element 1052 receives the input signal from path 1042 and generates a quasi-output signal along path 1054 by applying a variable gain factor to the input signal. Control system 1056 receives the quasi-output signal from path 1054 and generates a gain control signal along path 1058 which selects the gain factor used by gain element 1052 and gain element 1048. Gain element 1048 receives the delayed input signal from path 1046 and generates an output signal along path 1050 by applying a variable gain factor to the delayed input signal. The hybrid limiter does not require a control system and gain elements with precisely known characteristics, but it does require two gain elements with precisely matched characteristics. This is usually much easier to implement, even with analog technologies. Furthermore, by using the delay element, the hybrid limiter is also able to avoid overshoot in the output signal.

Figure 2:
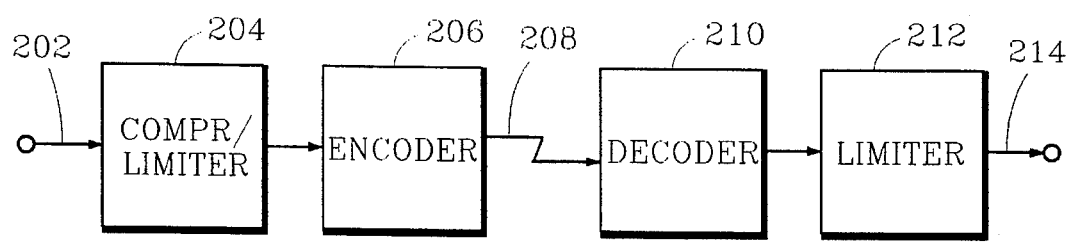
FIG. 2 is a functional block diagram of an STL incorporating an embodiment of the present invention.

FIG. 2 is a functional block diagram of a portion of a broadcast system including an STL incorporating one embodiment of the present invention. The following discussion more particularly describes various embodiments of the present invention for this application. The embodiments described below incorporate an input-controlled limiter, but it will be readily apparent in light of the prior art that these different embodiments may be modified to also incorporate an output-controlled limiter or a hybrid limiter as described above.

Referring to FIG. 2, compressor/limiter 204 receives a studio signal from path 202 and generates a peak-amplitude limited representation of the studio signal which it passes to perceptual-encoder 206. Encoder 206 generates an encoded signal which it passes along communication path 208. Decoder 210 receives the encoded signal from communication path 208, reproduces the compressed and limited signal, and passes the reproduced signal to limiter 212. Limiter 212 corrects any PLI in the reproduced signal and passes the corrected signal along path 214 to a broadcast transmitter. It should be understood that compressor/limiter 204 does not form part of the present invention.

For ease of discussion, preferred digital embodiments of the present invention for an FM-broadcast STL application are described which assume that the reproduced audio signal delivered to limiter 212 has a 15 kHz bandwidth and is sampled at a rate of 44.1 kilosamples/sec. Changes required to implement an embodiment of the present invention for use with signals having different characteristics are within the abilities of those having ordinary skill in the art.

B. Basic Structure

Figure 1:
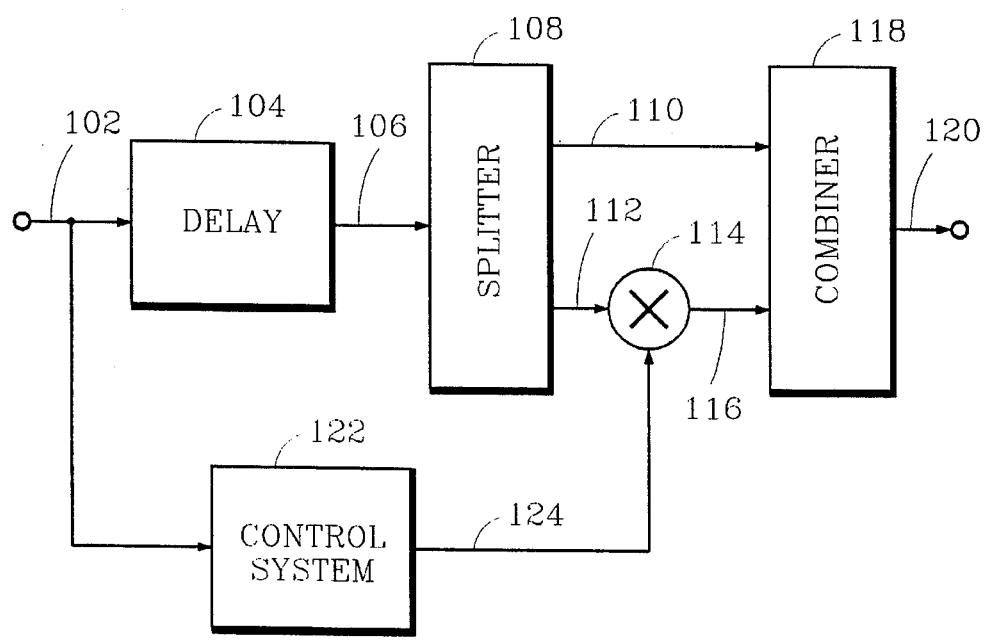
FIG. 1 is a functional block diagram illustrating the structure of one embodiment of an audio signal limiter according to various aspects of the present invention.

FIG. 1 illustrates the structure of one embodiment of an input-controlled limiter according to various aspects of the present invention. Delay element 104 receives an input signal from path 102 and passes the delayed signal along path 106 to splitter 108. Splitter 108 splits the delayed signal into at least two sub-signals, passing a first sub-signal along path 112 to gain element 114 and passing the remaining sub-signal or sub-signals along path 110 to combiner 118. Control system 122 receives the input signal from path 102 and generates a gain control signal along path 124 which selects the gain factor used by gain element 114. Gain element 114 receives the first sub-signal from path 112 and generates a second sub-signal along path 116 by applying a variable gain factor to the first sub-signal. Combiner 118 generates an output signal along path 120 by combining the sub-signals received from paths 110 and 116.

Splitter 108 divides the delayed input signal into two or more sub-signals representing two frequency subband components. The first frequency subband component is subject to PLI. The second frequency subband component includes that portion of the spectrum in which PLI does not exist. The first frequency subband component having PLI is represented in FIG. 1 by the first sub-signal passed along path 112 to gain element 114. The other frequency subband component is represented in FIG. 1 by the one or more sub-signals passed along path 110 to combiner 118.

1. Signal Processing Path

The structure shown in FIG. 1 has two paths. A signal processing path includes delay 104, splitter 108, gain element 114, and combiner 118. A separate control path, discussed below, includes control system 122.

Delay element 104 may be implemented by any technique appropriate for delaying the audio signal received from path 102. The duration of the delay is usually set substantially equal to the length of time required for control system 122 to respond to PLI requiring correction. One method which may be used to establish this duration is to establish the delay which yields the maximum cross-correlation score between the delayed signal on path 112 containing PLI and one minus the gain factor (1-g) generated by control system 122.

Splitter 108 may be implemented by any technique for dividing a signal into frequency subbands including, but not limited to, analog filters, digital filters, and so-called frequency-domain transforms.

Combiner 118 may be implemented by any technique for combining the sub-signals into a full-bandwidth signal. The combiner implementation technique will normally be the inverse of the implementation technique chosen for splitter 108.

Gain element 114 may be implemented by any technique appropriate for the signal received from path 112. For example, operational amplifiers may be used in analog systems and multiplication or scaling may be used in digital systems. The resolution and range of the gain element should be selected in conjunction with the operational characteristics of control system 122, discussed below.

2. Control Path

Figure 3:
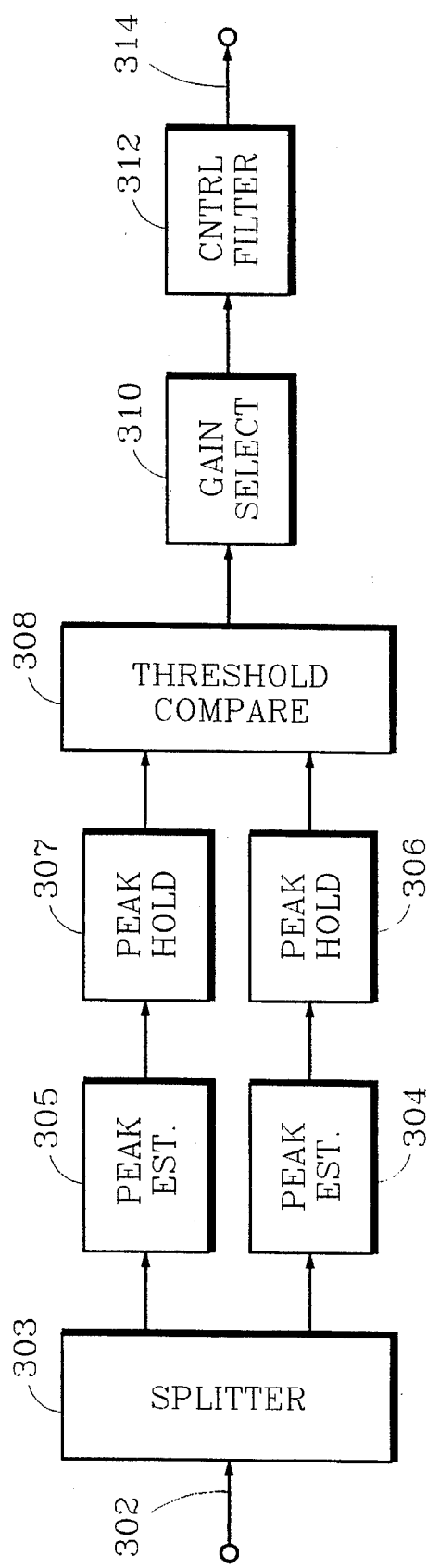
FIG. 3 is a functional block diagram of one embodiment of a control system according to various aspects of the present invention.

One embodiment of control system 122 is shown in FIG. 3. Referring to FIG. 3, splitter 303 splits the input signal received from path 302 into two frequency subband components in the same manner as that performed by splitter 108 discussed above. The second frequency subband component, which is assumed not to contain PLI, is passed to peak estimator 305. Peak estimator 305 estimates the peak amplitude of the second frequency subband component and passes the estimate to peak hold 307. Peak hold 307 passes to threshold compare 308 a pulse-shaped signal which holds the estimated peak amplitude for a specific period of time.

The first frequency subband component, which may contain PLI, is passed to peak estimator 304. Peak estimator 304 estimates the peak amplitude of the first frequency subband component and passes the estimate to peak hold 306. Peak hold 306 passes to threshold compare 308 a pulse-shaped signal which holds the estimated peak amplitude for a specific period of time.

Threshold compare 308 obtains a peak-amplitude estimate of the full-bandwidth input signal by combining the two peak hold signals and compares the it with a reference level. Threshold compare 308 passes the two peak hold signals and the results of the comparison to gain select 3 10. Gain select 310 selects a gain factor in response to the signals received from threshold compare 308 and passes the selected gain factor to control filter 312. Control filter 312 generates along path 314 a gain control signal in response to the selected gain factor. The functions represented in FIG. 3 affect both the steady-state and the dynamic characteristics of the control system.

The following discussion of the embodiment shown in FIG. 3 is directed toward digital implementations; however, it should be appreciated that corresponding functions may be implemented using analog techniques.

a. Peak Estimator

In a preferred embodiment of the present invention for an FM-broadcast STL, the first frequency subband component contains high-frequency spectral components up to about 15 kHz. Peak estimator 304 uses an "upsampling" filter to interpolate the samples of the first frequency subband component, thereby improving the accuracy of the peak-amplitude estimate. Although samples taken at or above the Nyquist rate permit accurate recovery of a sampled signal, it is well known that the samples themselves do not accurately represent the signal peak amplitude. This generally is of no concern in digital applications because only the ability of the maximum valued signal samples to pass through the digital system is relevant. In applications such as a broadcast STL, however, the actual peak amplitude of the analog signal reproduced from the digital signal is of concern. Therefore, the peak estimator function interpolates between samples to obtain a more accurate estimate.

In the same preferred embodiment, the second frequency subband component contains only frequencies below about 5 kHz. An accurate peak amplitude can be estimated accurately from samples taken at a rate of 44.1 kHz; therefore, peak estimator 305 does not need to interpolate the samples of the second frequency subband component.

Figure 4:
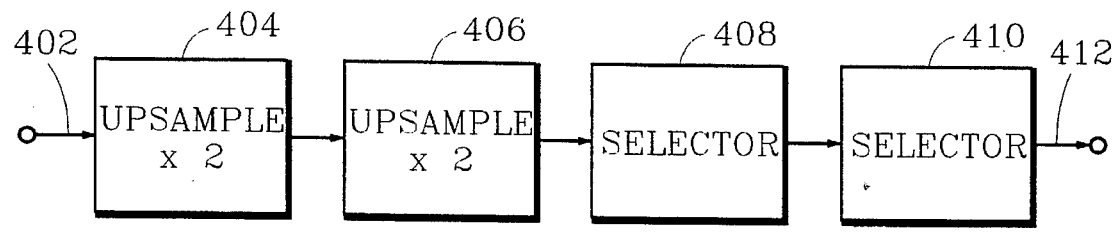
FIG. 4 is a functional block diagram of one embodiment of a peak-amplitude estimator.

FIG. 4 shows a functional block diagram of a preferred embodiment of an interpolating peak estimator. Upsampler 404 and upsampler 406 are each two-times upsampling filters, and together the two upsamplers generate four samples in response to each input signal sample received from path 402. Each upsampler can be implemented efficiently as a low-pass half-band FIR filter. More particularly, for the FM-broadcast STL application, filter characteristics are chosen so as to obtain a 15 kHz passband with −40 dB of attenuation in the stopband The filter for upsampler 404 comprises seventeen taps and upsamples to a rate of 88.2 kilo-samples/sec. The filter for upsampler 406 comprises nine taps and upsamples to a rate of 176.4 kilo-samples/sec.

Selector 408 compares the four most recent interpolated samples and selects the one with the largest absolute value. Selector 410 compares the magnitude selected by selector 408 with a stored value. Selector 410 passes the larger of the two values along path 412 and saves the value selected by selector 408 as the new stored value.

Conceptually, the peak estimator shown in FIG. 4 upsamples the input signal by four times and, for each set of four interpolated samples, selects the largest absolute value from the eight most recent interpolated samples.

b. Peak Hold

The functions represented by peak hold 306 and peak hold 307 shown in FIG. 3 are necessary because the limiting action of control system 122 and gain element 114 shown in FIG. 1 is not instantaneous. In order to minimize the audible effects of the limiting action within the signal processing path, it is important to control the rate at which the gain factor applied by gain element 114 is changed. Various considerations are discussed below. It is sufficient at this point to realize that the gain factor should not be changed instantaneously. Therefore, unless some compensation is made, the control system will not be able to adequately respond to short-duration PLI intervals. The function represented by peak hold 306 and peak hold 307 in FIG. 3 is one way in which compensation may be made.

Figure 5:
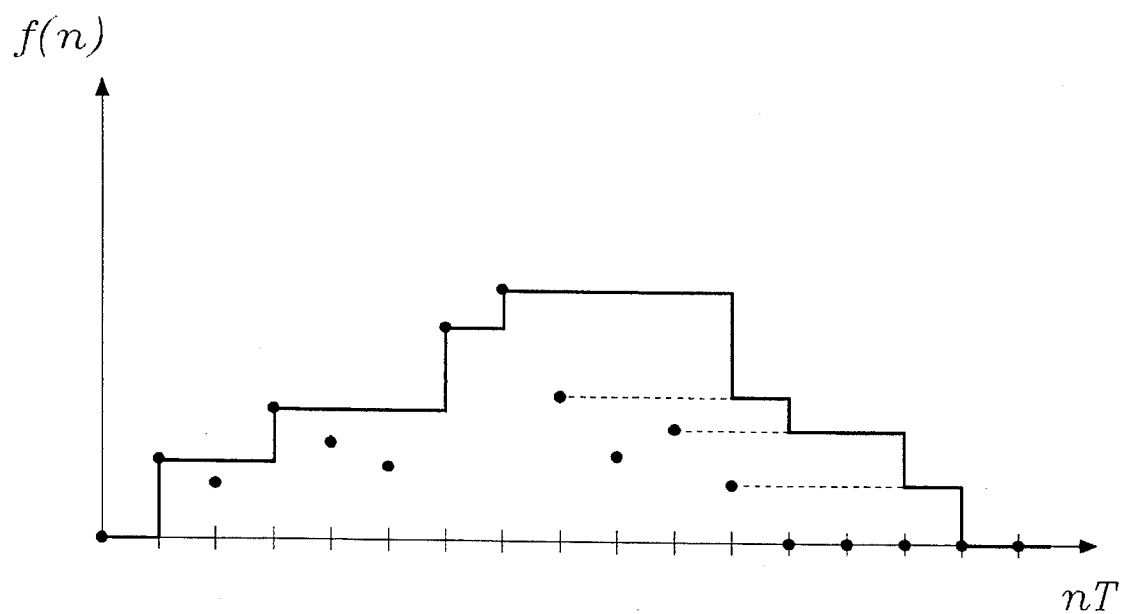
FIG. 5 is a hypothetical graphical representation of one peak hold function.

Each peak hold function generates a pulse signal of duration H having an amplitude equal to the peak-amplitude estimate received from the peak estimators. For example, in response to a peak-amplitude estimate of $x_1$ at time $t_1$, the peak hold function generates a pulse signal with an amplitude equal to $x_1$, starting at time $t_2$ and ending at time $t_1+H$. If a larger peak-amplitude estimate $x_2$ is received at time $t_2$ before the first pulse ends, however, the peak hold function immediately generates another pulse signal with an amplitude equal to $x_2$ of duration H starting at time $t_2$ and ending at time $t_2+H$. If a smaller peak-amplitude estimate $x_3$ is received during the current pulse signal at time $t_3$, the peak hold function generates a pulse signal with amplitude equal to $x_3$ starting at the end of the current pulse signal and ending at time $t_3+H$. FIG. 5 provides a hypothetical graphical representation of this function with a hold time of 4T.

The following pseudo-code program segment illustrates the logic of an embodiment which implements the peak hold function described above and illustrated in FIG. 5.

```
i ← 0
Y ← 0
X(0:H) ← 0
while TRUE
    X(i) ← x(n)
    if Y ≠ X(i+1) then
        Y ← max(Y,X(i))
```

-continued
```
    else
        Y ← max(X(i), . . . ,X(i+H−1))
    endif
    y(n) ← Y
    i ← i+1
endwhile
``` where x(n)=peak-amplitude estimate at time n,

H=the peak hold duration, and y(n)=peak hold function output at time n.

The program segment implements a circular buffer X of length H; therefore it should be understood that the variable i is an index or pointer to the buffer and the notation i+k represents the expression $$(i+k) - \text{int}\left(\frac{i+k}{H}\right) \cdot H$$

where int(x)=the integer portion of x.

After initializing the variables i, Y and circular buffer X, the program segment contained within the "while" group is repetitively executed. As each peak-amplitude estimate x(n) at time n is received, its magnitude is stored in circular buffer X. The current value of Y is compared to the value stored H time periods earlier in buffer X. If the two are not equal, Y is set equal to the larger of the magnitude just stored in buffer X or the current value of Y. If they are equal, this indicates that the peak value has been held for duration H and Y is set equal to the largest of the last H magnitudes stored in buffer X. Many other implementations are possible.

The length of duration H is a design choice which should be made together with other design choices affecting the gain select and the control filter functions, discussed in more detail below.

c. Threshold Compare

Threshold compare 308 compares an estimate of the full-bandwidth input signal peak amplitude with a reference level and passes the results of the comparison to gain select 310. In an embodiment according to FIG. 3, an estimate of the full-bandwidth input signal may be obtained by combining the peak hold signals from peak hold 306 and peak hold 307.

In a preferred embodiment of the present invention for broadcast STL applications such as that shown in FIG. 2, the reference level is predefined according to the peak-amplitude limit imposed by compressor/limiter 204 upon the studio signal. The threshold compare reference level is the desired peak-amplitude limit of the signal reproduced by perceptual-decoder 210.

In principle, the reference level need not be predefined but could be provided by an external signal. The desired peak-amplitude level could be passed with the signal having PLI. Referring to FIG. 2, for example, the desired peak-amplitude limit could be encoded by encoder 206, passed with the encoded signal along path 208, extracted by decoder 210 and provided to limiter 212. Many variations are possible.

d. Gain Select

Gain select 310 establishes a gain factor in response to the output of threshold compare 308. If the peak-amplitude estimate of the full-bandwidth signal is less than the reference level, a gain factor equal to one is selected. If the peak-amplitude estimate exceeds the reference level, however, a gain factor is selected which effectively reduces the amplitude of the frequency subband component containing PLI such that the peak amplitude of the output signal is reduced to the desired amplitude defined by the reference level. Additional details pertaining to the design of limiters may be found in Bosi, "Low-Cost/High-Quality Digital Dynamic Range Processor," AES 91st Convention, New York, October 1991, Preprint 3133, which is incorporated by reference in its entirety.

For conventional full-bandwidth limiters, a gain factor g may be established at time n substantially in accordance with $$g(n) = 10^{[Th-20 \log x(n)] \cdot \frac{R-1}{20R}} \quad (1)$$

where g(n)=selected gain factor at time n,

Th=reference level expressed in dB, x(n)=peak-amplitude estimate at time n, and

R=compression ratio.

Alternatively, a gain factor g(n) may be obtained from the ratio between the reference level Th and the peak-amplitude estimate x(n). This is equivalent to the results obtained from equation (1) where the compression ratio R is infinitely large.

By using equation (1) and setting the compression ratio R at some finite value, gain select 310 is able to select a gain factor which balances PLI reduction with the decrease in apparent loudness of the output signal. For many broadcast STL applications, a compression ratio R=100 effectively removes PLI.

For purposes of the present invention, however, the gain factor calculated according to equation (1) may not provide nearly enough limiting if equation (1) is applied to only a single peak-amplitude estimate. At least two peak-amplitude estimates must be used in applications such as the broadcast STL discussed above where PLI is confined to certain frequency bands which do not represent the predominant spectral energy for the full-bandwidth signal. Nevertheless, it is useful to first describe a simpler gain select function which assumes that the frequency band containing PLI represents substantially the full-bandwidth signal energy. For ease of discussion, this gain select function is referred to herein as "simplex gain select" because it requires only one input source, the estimated peak amplitude of the frequency subband component containing PLI.

i) simplex gain select

Although equation (1) defines the desired gain to select, a straight-forward calculation is computationally intensive. In a preferred embodiment, a more efficient process is implemented by selecting the desired gain from a pre-computed gain table. The gain table T contains a set of gain factors which may be defined by the following pseudo-code program segment:

$N \leftarrow 16$
$Th \leftarrow -2$
$R \leftarrow 100$
$A_{step} \leftarrow 16$
$S \leftarrow (R-1) / R$
$A_{max} \leftarrow 2^{N-1}-1$
$A_{th} \leftarrow 10^{Th/20} \cdot A_{max}$
$T_{SZ} \leftarrow (A_{max} - A_{th}) / A_{step}$
$\Delta \leftarrow 0$
$A \leftarrow A_{th}$
for $i$ from 0 to $T_{SZ}-1$
    $T[i] \leftarrow 10^{\Delta \cdot S/20}$
    $A \leftarrow A + A_{step}$
    $\Delta \leftarrow Th - 20 \log A$
endfor where N=number of bits available for digital representation, Th=reference level in dB, R=compression ratio, $A_{step}$=amplitude step size, $A_{max}$=maximum digital representation, $A_{th}$=absolute reference level, $T_{SZ}$=gain table size, and T[i]=gain factor i in the gain table.

In one embodiment, sixteen bits are used to express signal amplitudes, therefore, N is set equal to 16. It should be appreciated that the gain table T contains anti-log gain factors, therefore the gain increment Δ between adjacent table entries is not constant. The amplitude step size $A_{step}$ is selected such that the largest gain increment Δ between adjacent table entries is not too large. In a preferred embodiment, $A_{step}$ is set to sixteen which ensures that Δ is always less than 0.05 dB.

In the preferred embodiment, gain select 310 receives from threshold compare 308 a signal indicating the difference D between a peak-amplitude estimate y(n) and the reference level $A_{th}$. Gain select 310 uses D as an index into the gain table T and thereby selects the gain factor g appropriate to reduce the PLI causing the peak amplitude error, or $$g(n)=T[y(n)-A_{th}]. \quad (2)$$

Many other implementations of the gain select function are possible.

ii) duplex gain select

In applications having PLI occurring in frequency sub-band components which have significantly less than the full-bandwidth spectral energy, simplex gain select does not provide enough limiting to optimally reduce PLI to desired levels. A more optimum gain select function, referred to herein as "duplex gain select," requires two peak-amplitude estimates.

The conceptual basis for duplex gain select assumes that the sum of the peak amplitudes in various frequency sub-bands equals the peak amplitude of the full-bandwidth input signal. For example, two bandwidth limited signals having peak-to-peak amplitudes of 0.4 volts and 0.6 volts, respectively, when combined, will form a signal having a peak-to-peak amplitude of one volt. Although this assumption is not precisely correct, it is accurate enough for the purposes served by the present invention.

In an embodiment of the present invention for applications such as the broadcast STL, the signal received from peak hold 307 represents the peak amplitude of frequencies below about 5 kHz. The peak amplitude estimate for frequencies above about 5 kHz is received from peak hold 306 via threshold compare 308. The peak amplitude of the full-bandwidth input signal at time n is assumed to be the sum of these peak amplitude estimates at time n, or $$P_t(n)=P_L(n)+P_H(n)$$

where $P_L(n)$=held peak-amplitude estimate for low frequencies at time n, and $P_H(n)$=held peak-amplitude estimate for high frequencies at time n.

For this particular application, it is assumed that only the high frequencies contain PLI, therefore, gain reduction should be applied only to these frequencies.

Whenever $P_t(n)$ exceeds the reference level, gain select 310 establishes a gain factor $\hat{g}(n)$ to apply to the high frequencies in order to reduce the full-bandwidth peak amplitude to substantially the reference level. This gain factor may be obtained by solving the following two independent linear equations in two unknowns. These equations are expressed in terms of peak-amplitude estimates which are normalized or scaled by the desired reference level such that the normalized desired peak amplitude is equal to one; thus:

$$p_L(n)+p_T(n)=p_T(n)$$

$$p_L(n)+\hat{g}(n) \cdot p_H(n)=1.0$$

where $p_L(n)$=normalized low frequency held peak-amplitude estimate at time n, $p_H(n)$=normalized high frequency held peak-amplitude estimate at time n, $p_T(n)$=normalized full-bandwidth signal peak-amplitude estimate at time n, and $\hat{g}(n)$=gain factor required to optimally correct PLI at time n.

By solving these two equations simultaneously, the gain factor is seen to be $$\hat{g}(n) = 1 - \frac{p_T(n)-1}{p_H(n)} = \frac{1-p_L(n)}{p_H(n)} \qquad (3)$$

The gain table discussed above can be used to provide a gain factor which balances PLI reduction against loss of apparent loudness in the output signal. Conceptually, gain factor $\hat{g}(n)$ is the ratio between the high-frequency signal's "proper" level and its peak amplitude. This ratio can be expressed as $1/(1+e)$ where e is the normalized deviation between the normalized high frequency signal peak amplitude $p_H(n)$ and the normalized amplitude required to correct PLI. Referring to equation (2), the index i into gain table T[i] is seen to be the actual deviation between the actual peak-amplitude estimate x(n) and the actual reference level $A_{th}$. The actual deviation may be obtained by scaling the normalized deviation e with the actual reference level $A_{th}$. Therefore, gain select 310 may obtain a gain factor from the gain table entry $T[e \cdot A_{th}]$.

Although the gain select function directly affects the performance of a particular embodiment, it should be understood that no particular gain select function is critical to the practice of the present invention. Other duplex gain select functions are possible and will be apparent to those with ordinary skill in the art.

e. Control Filter

The dynamic characteristics of the control system must be established by balancing two conflicting goals. One the one hand, the control system should respond quickly to the onset of PLI and recover quickly after PLI has stopped so that the apparent loudness of the reproduced signal is not adversely affected more than necessary. On the other hand, the control system should not respond and recover so quickly that it generates audible modulation distortion in the reproduced signal. The particular embodiment shown in FIG. 3 from input path 302 up through gain select 310 allows the control system to respond and recover as quickly as possible. Control filter 312, however, restricts the rate of response to the generation of audible artifacts.

Referring to FIG. 1, gain element 114 responds to a gain control signal received from control system 122 to amplitude modulate the signal arriving along path 112. As a result of the amplitude modulation, distortion in the form of sidebands is generated.

Control filter 3 12 shown in FIG. 3 is essentially a low-pass filter designed to limit the frequency of the amplitude modulation and thereby limit the bandwidth of the sidebands. The LPF bandwidth of control filter 312 should be chosen so that the sideband bandwidths are confined to within a psychoacoustic critical bandwidth of the spectral components modulated by the variable gain element. In the preferred embodiment for the FM-broadcast STL application discussed above, the function is implemented as a third order IIR filter with a cutoff frequency of 880 Hz, a stopband attenuation of −40 dB, and 0.09 dB of ripple in the low-pass band.

By examining the effects of the modulation sidebands with respect to the psychoacoustic masking thresholds of the modulated signal, the characteristics of the control filter may be specified so as to permit the fastest control system response possible consistent with ensuring the modulation artifacts are inaudible.

C. Structure of Alternate Embodiments

Many variations in embodiments of the present invention are possible. The following describes differences between the alternate embodiments and the basic structure described above.

Figure 6:
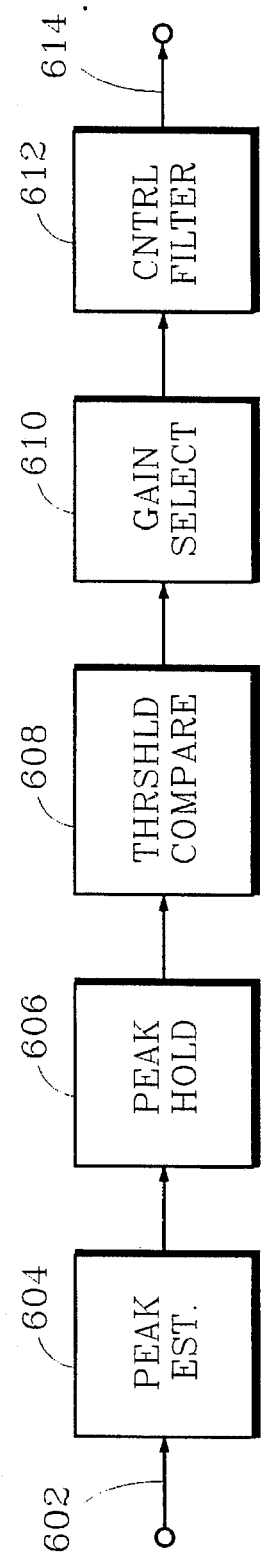
FIG. 6 is a functional block diagram of one embodiment of a control system according to various aspects of the present invention.

One embodiment of control system 122 is shown in FIG. 6. Referring to FIG. 6, 604 estimates the peak amplitude of the input signal received from path 602 and passes the estimate to peak hold 606. Peak hold 606 passes to threshold compare 608 a pulse-shaped signal which holds the estimated peak amplitude for a specific period of time. Threshold compare 608 compares the amplitude of the peak hold signal with a reference level and passes the results of the comparison to gain select 610. Gain select 610 selects a gain factor in response to the signals received from threshold compare 608 and passes the selected gain factor to control filter 612. Control filter 612 generates along path 614 a gain control signal in response to the selected gain factor.

The functions performed by peak estimator 604, peak hold 606 and threshold compare 608 are substantially similar to the functions described above for the corresponding elements shown in FIG. 3 along the path carrying the first frequency subband component. Unlike the counterpart threshold compare 308, however, threshold compare 608 receives an estimate of the full-bandwidth input signal directly from one peak hold signal. Furthermore, threshold compare 608 need not pass any peak hold signal to gain select 610, but can pass only the difference between the peak hold signal and the reference level.

Gain select 610 establishes a gain factor in response to the output of threshold compare 608. If the peak-amplitude estimate is less than the reference level, a gain factor equal to one is selected. If the peak-amplitude estimate exceeds the reference level, however, a gain factor is selected which reduces the amplitude of the frequency subband component containing PLI.

The gain select function may be implemented using equation (1) above, by selecting a gain factor equal to the ratio between the reference level and the peak-amplitude estimate, or by using a gain table such as that shown in equation (2). Although the choice of gain select function may greatly affect system performance, no particular function is critical to the practice of the present invention.

It should be appreciated that gain select 610 uses a simplex gain select function which generates a gain control signal in response to the full-bandwidth input signal. Other embodiments incorporating duplex gain select functions such as those described above may generate a more optimal gain factor by responding to signal levels in both the full-bandwidth and in the portion of the bandwidth in which PLI is to be limited. Although the implementation shown in FIG. 6 may be suboptimal, it provides acceptable performance for a variety of applications including the broadcast STL application discussed above, and it requires fewer processing resources than those required by the more optimum duplex embodiments.

Figure 7:
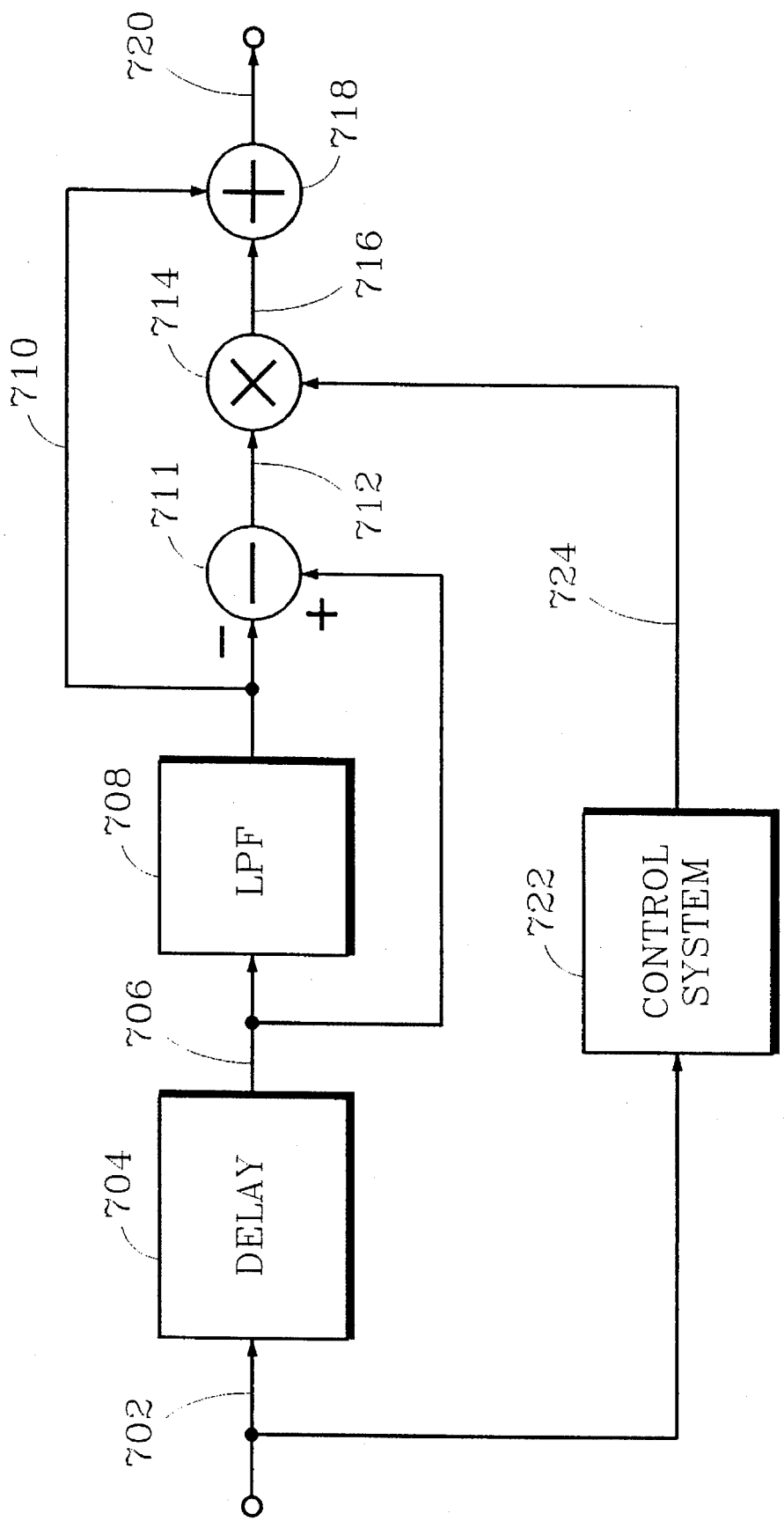
FIG. 7 is a functional block diagram illustrating an alternative band-splitting structure within an embodiment of an audio signal limiter according to various aspects of the present invention.

FIG. 7 illustrates an alternative but equivalent embodiment to that shown in FIG. 1. As shown in FIG. 7, the splitter is implemented with a low-pass filter and a subtractor, and the combiner is implemented with an adder. LPF 708 receives the delayed full-bandwidth signal from path 706 and passes the low-frequency spectrum along path 710 to subtractor 711 and combiner 718. Subtractor 711 receives the delayed full-bandwidth signal from path 706, subtracts the low-frequency components from the full-bandwidth components and passes the resulting signal having only high-frequency components along path 712 to gain element 714. Gain element 714 receives a gain control signal from control system 722 along path 724, applies a variable gain factor to the signal received from path 712, and passes the result to combiner 718. Combiner 718 adds the signals received from paths 710 and 716 to generate a full-bandwidth output signal along path 720.

Figure 8:
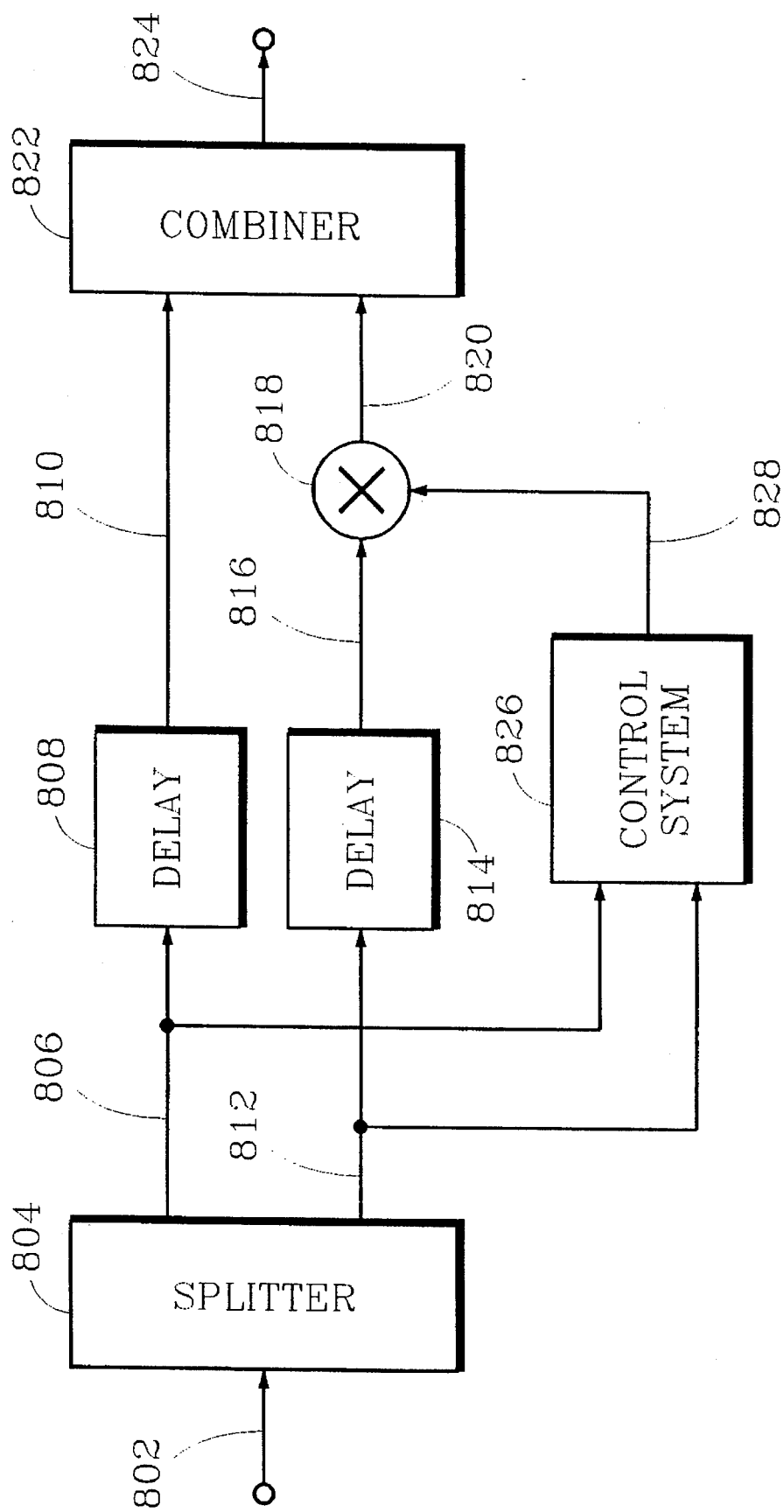
FIG. 8 is a functional block diagram illustrating the structure of one embodiment of an audio signal limiter according to various aspects of the present invention.

FIG. 8 illustrates an alternative embodiment to that shown in FIG. 1 for implementations incorporating a duplex gain select function. The functions performed by splitter 804 and delay elements 808 and 814 are interchanged as compared to that shown in FIG. 1. As a result, control system 826 does not require a separate splitter. The gain select function can directly apply equation (3), discussed above, to the first and second frequency subband components received from paths 812 and 806, respectively.

Figure 9:
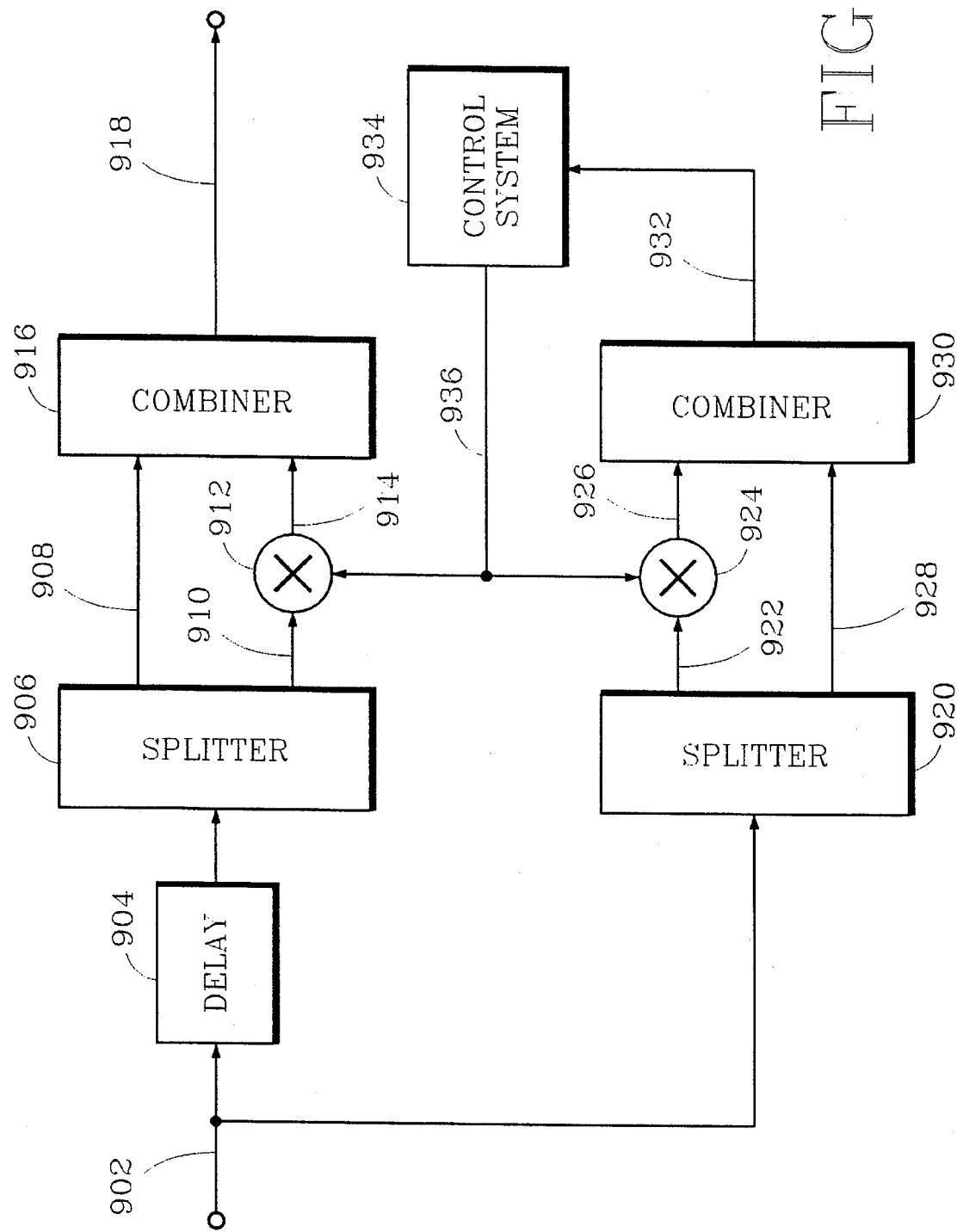
FIG. 9 is a functional block diagram illustrating an alternative hybrid input-controlled/output-controlled structure according to various aspects of the present invention.

FIG. 9 illustrates an alternative embodiment using a hybrid limiter structure similar to that shown in FIG. 10c. Delay element 904 receives a full-bandwidth signal from path 902. Splitter 906 splits the delayed full-bandwidth signal into a first frequency subband component, passed along path 910, and a second frequency subband component passed along path 908. Gain element 912 receives the first frequency subband component from path 910, applies an adaptive gain factor to the first frequency subband component and passes the result along path 914 to combiner 916. Combiner 916 combines the first and second frequency subband components received from paths 914 and 908, respectively, and generates an output signal along path 918. Splitter 920 splits the full-bandwidth signal received from path 902 into a first frequency subband component, passed along path 922, and a second frequency subband component passed along path 928. Gain element 924 applies an adaptive gain factor to the first frequency subband component and passes the result to combiner 930. Combiner 930 combines the first and second frequency subband components received from paths 926 and 928, respectively, and generates a quasi-output signal along path 932. Control system 934 receives the quasi-output signal from path 932 and passes a gain control signal along path 936 to gain elements 912 and 924.

Because output-controlled limiters are insensitive to precise control system characteristics, embodiments of the present invention according to FIG. 9 do not require accurate gain tables such as that discussed above.

The present invention may also be applied to multi-channel applications. In one digital embodiment incorporating a control system in accordance with the structure shown in FIG. 6, the maximum peak-amplitude estimate across all channels is presented to the input of a single peak hold 606. The remainder of the control system performs in a manner substantially the same as that described above.

In an alternative embodiment which requires fewer processing resources, the largest magnitude sample for all channels is passed along path 602 to a single peak estimator 604. Peak estimator 604 interpolates these largest magnitude samples and passes a peak-amplitude estimate to peak hold 606.

It will be apparent that the various functions in the control system structure as shown in FIG. 6 may be shared across multiple channels in a similar manner as desired.

Many other control system embodiments are possible for multi-channel applications; however, each must balance reduction in apparent loudness of each channel, distortion of relative channel loudness, and modulation of frequency subband components containing PLI by other frequency subband components without PLI. For example, the maximum PLI-to-reference level ratio across all channels may be used to select a gain factor for each channel using the duplex gain select function described above. In this case, the duplex gain select function is applied using the peak-amplitude estimates for each respective channel in combination with the common maximum PLI ratio.

The alternatives described above are given by way of example only, and illustrate that the present invention is applicable to a broad variety of structures and implementations.

We claim:

1. A signal processing system comprising
   a perceptual encoder responsive to an input audio signal limited to a first peak amplitude,
   a perceptual decoder responsive to said perceptual encoder, wherein the output of said decoder is a processed audio signal not limited to said first peak amplitude,
   estimating means for generating an estimated peak amplitude of said processed audio signal, and
   limiting means responsive to said processed audio signal for generating an output audio signal limited to a second peak amplitude by applying a gain factor to a portion of the total bandwidth of said processed audio signal, said gain factor established in response to said estimated peak amplitude.

2. A signal processing system comprising
   processing means for generating a processed audio signal in response to an input audio signal having an apparent loudness and being limited to a first peak amplitude, wherein said processed audio signal has an apparent loudness substantially the same as said apparent loudness of said input audio signal but is not limited to said first peak amplitude, wherein said processing means for generating said processed audio signal comprises a perceptual-coding system,
   estimating means for generating an estimated peak amplitude of said processed audio signal, and
   limiting means responsive to said processed audio signal for generating an output audio signal limited to a second peak amplitude by applying a gain factor to a portion of the total bandwidth of said processed audio signal, said gain factor established in response to said estimated peak amplitude.

3. A signal processing system according to claim 1 or 2 wherein said processed audio signal comprises signal samples and wherein said estimating means comprises means for upsampling said signal samples.

4. A signal processing system according to claim 1 or 2 wherein said estimating means generates said estimated peak amplitude in response to the full bandwidth of said processed audio signal.

5. A signal processing system according to claim 1 or 2 wherein said estimating means comprises means for generating said estimated peak amplitude in response to a first peak amplitude estimate of a first sub-signal representing said processed audio signal within a first frequency subband and in response to a second peak amplitude estimate of a second sub-signal representing said processed audio signal within a second frequency subband.

6. A signal processing system according to claim 5 wherein said first peak amplitude estimate is established by upsampling said first sub-signal.

7. A signal processing system according to claim 5 wherein said gain factor is established in response to said first peak amplitude estimate.

8. A signal processing system according to claim 5 wherein said gain factor is established in response to said first peak amplitude estimate and said second peak amplitude estimate.

9. A signal processing system according to claim 1 or 2 wherein said limiting means comprises peak hold means for generating a peak-hold signal by holding said estimated peak amplitude, threshold compare means for comparing said peak-hold signal with a reference level and for generating a gain select signal in response thereto, and gain select means for establishing said gain factor in response to said gain select signal.

10. A signal processing system according to claim 1 or 2 wherein said limiting means further comprises means for controlling the rate of change of said gain factor so as to confine resulting amplitude modulation sidebands to within substantially a critical bandwidth.

11. A signal processing system for processing an input audio signal limited to a first peak amplitude limit, said system comprising a split-band encoder responsive to said input audio signal, a split-band decoder responsive to said encoder, a peak-amplitude estimator responsive to said split-band decoder, a gain control responsive to said peak amplitude estimator and to a second peak amplitude limit, one or more filters responsive to said decoder collectively having a first filter output and one or more second filter outputs, a limiter having variable gain and responsive to said first filter output, wherein said variable gain is responsive to said gain control, and a combiner having a system output and responsive to said limiter and said one or more second filter outputs.

12. A signal processing system according to claim 11 wherein said peak-amplitude estimator comprises one or more filters responsive to said split-band decoder collectively having a first filter output and a second filter output, a first peak-amplitude estimator responsive to said first filter output, a second peak-amplitude estimator responsive to said second filter output, and a combiner responsive to said first peak-amplitude estimator and to said second peak-amplitude estimator.

13. A signal processing system for processing an input audio signal limited to a first peak amplitude limit, said system comprising a split-band encoder responsive to said input audio signal, a split-band decoder responsive to said encoder, two or more filters responsive to said split-band decoder collectively having a first filter output and one or more second filter outputs, a peak-amplitude estimator responsive to said first filter output and to at least one of said one or more second filter outputs, a gain control responsive to said peak amplitude estimator and to a second peak amplitude limit, a limiter having variable gain and responsive to said first filter output, wherein said variable gain is responsive to said gain control, and a combiner having a system output and responsive to said limiter and to said one or more second filter outputs.

14. A signal processing system according to claim 11 or 13 wherein said split-band decoder generates an output signal comprising samples, and wherein said peak-amplitude estimator further comprises an upsampling filter.

15. A signal processing system according to claim 11 or 13 wherein said gain control further comprises a filter limiting rate of change of said variable gain so as to confine resulting amplitude modulation sidebands to within substantially a critical bandwidth.

* * * * *

UNITED STATES PATENT AND TRADEMARK OFFICE
CERTIFICATE OF CORRECTION

PATENT NO. : 5,579,404
DATED : November 26, 1996
INVENTOR(S) : Louis Dunn Fielder et al.

It is certified that error appears in the above-identified patent and that said Letters Patent is hereby corrected as shown below:

<u>Column 16,</u>
Line 6, cancel beginning with "12. A signal processing system" to and including "peak-amplitude estimator"
Line 16, insert the following claim:

12. A signal processing system according to claim 11 wherein said peak-amplitude estimator comprises a third filter responsive to said split-band decoder having a third filter output, a third filter responsive to said split-band decoder having a fourth filter output, a first peak-amplitude estimator responsive to said third filter output, a second peak-amplitude estimator responsive to said fourth filter output, and a combiner responsive to said first peak-amplitude estimator and to said second peak-amplitude estimator.

Signed and Sealed this

Fifteenth Day of February, 2005

JON W. DUDAS
*Director of the United States Patent and Trademark Office*